United States Patent
King et al.

(10) Patent No.: US 7,952,351 B2
(45) Date of Patent: May 31, 2011

(54) METHOD AND SYSTEM OF MR IMAGING WITH REDUCED FSE CUSP ARTIFACTS

(75) Inventors: Kevin F. King, Menomonee Falls, WI (US); Richard Scott Hinks, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 755 days.

(21) Appl. No.: 11/781,025

(22) Filed: Jul. 20, 2007

(65) Prior Publication Data

US 2009/0039882 A1    Feb. 12, 2009

Related U.S. Application Data

(63) Continuation of application No. 11/176,921, filed on Jul. 7, 2005.

(51) Int. Cl.
*G01V 3/00* (2006.01)
(52) U.S. Cl. .......................... 324/307; 324/309
(58) Field of Classification Search .......... 324/300–345; 600/407–445
See application file for complete search history.

(56) References Cited

U.S. PATENT DOCUMENTS

| | | | |
|---|---|---|---|
| 4,636,728 A | 1/1987 | Compton et al. | |
| 4,665,367 A * | 5/1987 | Kramer et al. | 324/309 |
| 6,289,232 B1 | 9/2001 | Jakob et al. | |
| 6,556,009 B2 * | 4/2003 | Kellman et al. | 324/309 |
| 6,900,635 B1 * | 5/2005 | Petropoulos et al. | 324/318 |
| 6,975,115 B1 * | 12/2005 | Fujita et al. | 324/318 |
| 7,250,762 B2 * | 7/2007 | King et al. | 324/309 |
| 7,683,614 B2 * | 3/2010 | Posse | 324/307 |
| 2006/0161060 A1 * | 7/2006 | Pai | 600/431 |
| 2008/0129298 A1 * | 6/2008 | Vaughan et al. | 324/322 |
| 2008/0262339 A1 * | 10/2008 | Garwood et al. | 600/413 |
| 2009/0264734 A1 * | 10/2009 | Degani et al. | 600/420 |

OTHER PUBLICATIONS

Steckner MC, Dannels WR. The FSE "cusp" artifact: interactions between RF rolloff, gradient rollover, and B0 homogeneity. In: Proceedings of the 3rd SMR, Nice, 1995, 765.

Kim JK, White LM, Hinks RS, King KF. The FSE cusp artifact: a phase wrap-in artifact seen on routine clinical MR images of the knee.

Pruessmann KP, Weiger M, Scheidegger MB, Boesiger P. Sense: sensitivity encoding for fast MRI. Magn Reson Med 1999;42:952-962.

(Continued)

*Primary Examiner* — Brij B Shrivastav
(74) *Attorney, Agent, or Firm* — Ziolkowski Patent Solutions Group, SC

(57) ABSTRACT

Coil sensitivity of a receive coil to a gradient null location is measured and, from the measurements, a coil calibration value is determined and used to modify the MR data acquired with that receive coil to reduce the adverse effects of gradient nulling on MR images. Coil sensitivity values are determined for each coil of a coil array and the data for each coil is respectively weighted. An image that is substantially free of gradient null artifacts or ghosting is then reconstructed from the weighted data.

24 Claims, 7 Drawing Sheets

OTHER PUBLICATIONS

Press WH, Teukolsky SA, Vetterling WT, Flannery BP. Numerical Recipes in C. Cambridge: Cambridge University Press; 1992, pp. 61-66, and 808-812.

Kellman P, Mcveigh ER. Ghost artifact cancellation using phase array processing. Magn Reson Med 2001;46:335-343.

Larkman DJ, Herlihy AH, Coutts GA, Hajnal JV. Elimination of magnetic field foldover artifacts in MR images. J Magn Reson Imaging 2000;12:795-797.

Walsh DO, Gmitro AF, Marcellin MW. Adaptive reconstruction of phased array MR imagery. Magn Reson Med 2000;43:682-690.

Bydder M, Larkman DJ, Hajnal JV. Detection and elimination of motion artifacts by regeneration of k-space. Magn Reson Med 2002;47:677-686.

Bydder M, Atkinson D, Larkman D, Hill DLG, Hajnal JV. SMASH navigators. Magn Reson Med 2003;49:493-500.

* cited by examiner

METHOD AND SYSTEM OF MR IMAGING WITH REDUCED FSE CUSP ARTIFACTS

CROSS REFERENCE TO RELATED APPLICATIONS

The present application is a continuation of, and claims priority to, U.S. patent application Ser. No. 11/176,921, filed on Jul. 7, 2005, the disclosure of which is incorporated herein by reference.

BACKGROUND OF THE INVENTION

The present invention relates generally to magnetic resonance (MR) imaging and, more particularly, to a method and system of parallel imaging and image reconstruction that reduces the adverse effects of gradient nulls on a reconstructed image.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

As described above, magnetic field gradients are employed for spatial localization during MR imaging. Ideally, the magnetic field gradients have linear spatial dependence (gradient fields) in three orthogonal directions. In practice, however, the gradient fields are generally only approximately linear within a limited volume. As a result, it is not uncommon for the gradient field at one or more locations to be negligibly small. In other words, the net magnetic field (the summation of the polarizing $B_0$ magnetic field and the gradient field) at a given location may have nearly zero slope. These points of near-zero slope are commonly referred to as gradient nulls and can adversely affect image quality.

That is, if magnetization is present at such a location and the transmit RF field is sufficiently large at that location to excite the magnetization, the resulting signal can cause artifacts. Moreover, since the gradient field at a gradient null location provides almost no spatial encoding, the signal collapses upon itself within the image. As a result, the signal is of high intensity and can appear as a bright artifact in the reconstructed image.

To help negate the effects of these gradient nulls, gradient coils are typically constructed such that the gradient null locations lie outside the imaging volume (e.g. the center 48×48×48 $cm^3$). However, it is possible for the signal from the gradient null to alias into the imaging volume with some phase or slice encoding processes. Moreover, if the signal does not directly alias into the imaging volume, system hardware instabilities, such as in the gradient or RF coils, eddy currents, or k-space modulation resulting from refocusing or different magnetization pathways in some echo train pulse sequences can cause ghosting of the intense signal in the phase or slice encoding directions. Moreover, this ghosted signal can manifest itself in the imaging volume even if the primary signal from the gradient null is not in the imaging volume.

While a number of MR imaging techniques can be impacted by gradient nulls, fast spin echo (FSE) imaging is particularly prone to gradient null ghosting. Fast spin echo imaging has a signal modulation that is inherent in the FSE pulse sequence even in the absence of system hardware instability that cause the aforementioned ghosting to occur in the reconstructed image. As a result, this gradient null artifact in FSE imaging is commonly referred to as a "FSE cusp artifact".

This artifact has been shown to be particularly prevalent with spine imaging along the sagittal or coronal planes. Sagittal or coronal spine imaging is customarily carried out with a multiple-element receive coil or coil array with the coil elements or coils linearly arranged in a line in the superior-inferior direction. Phase encoding is typically defined in the superior-inferior direction for spine imaging to reduce ghosting from cerebral spinal fluid (CSV) flow. A gradient null typically lies either superior to or inferior of the imaging volume and, as a result, the intense signal associated therewith can alias directly into the imaging volume because of the superior-inferior phase encoding direction. Therefore, with spine imaging, the field-of-view (FOV) in the phase encoding direction is typically doubled relative to a desired FOV. Data from the excess FOV, which contains the gradient null signal, is then discarded. This larger-than-desired FOV is often referred to as a "no phase wrap FOV" as the FOV is purposely made larger than needed to prevent aliasing or phase wrap. Further, even with a "no phase wrap FOV" to prevent the signal from the gradient null from overlapping anatomy of interest, ghosting from the gradient null is possible within the desired FOV with FSE and similar pulse sequences.

A number of techniques have been developed to reduce the impact of gradient null ghosting or artifacts.

One proposed solution is centered on improving gradient coil design. Accordingly, the coil can be constructed such that RF transmit coil falloff and gradient coil locations are matched to one another. By moving the gradient null locations into an area of sufficiently small RF transmit energy, the transverse magnetization that is excited at the nulls is negligible. While it is recognized that improved gradient coil design would help reduce the impact of gradient nulls, such a solution would require retrofitting existing MR scanners with new hardware, which could be cost-prohibitive.

It has also been suggested that an RF blanket could be used to suppress the gradient null artifact through the absorption of RF energy near the gradient null to prevent the excitation of transverse magnetization. A drawback of an RF blanket, however, is that to be effective, the RF blanket must be precisely positioned within the imaging volume. Acquiring pre-scan knowledge of a gradient null location can be time consuming and negatively affect subject throughput. Moreover, it is possible for a gradient null to be near a subject's head. As such, to be effective, the subject's head may need to be overlaid with the blanket. Not only would such a placement of the blanket be uncomfortable for some subjects, but be impractical for near-head spine scans.

Chopping or phase cycling the RF excitation pulse has also been suggested as a solution. It has been suggested the gradient null artifact may be suppressed by chopping the 90 degree excitation pulse of a spin echo or FSE pulse sequence.

However, such a solution ignores that the artifact signal, which will be excited by the RF excitation pulse, has the same polarity as the desired signal that is to be excited by the RF pulse. As such, the artifact will not be eliminated after the chopped signals are subtracted.

In another proposed solution, it has been suggested that slice gradient spoilers may be effective in suppressing the gradient null artifact when the artifact is created by RF pulses other than the excitation pulse, e.g. chemical or spatial saturation pulses, refocusing pulses, or fast recovery flip-up pulses. Such a solution would only effective if the gradient field from the spoiler gradient is sufficiently large at the null location to provide substantial dephasing over a voxel (volume element). As a practicality, however, the gradient null locations along the three gradient axes are typically relatively close together because all three gradient coils have similar spatial coverage or FOVs. Thus, the slice select gradient has relatively little slope at the location where the phase encoding gradient has a null. As such, it is recognized that spoilers on any axis would be ineffective at suppressing the signal from the gradient null.

Another proposed solution involves toggling the polarity of the phase encoding gradient so to remove or reduce the gradient null artifact by shifting the gradient null location. Such an approach is believed impractical. That is, the optimal polarity of the gradient is unknown in advance. Moreover, it is possible for the gradient null artifact to be just as severe at the new location. In other words, there is no guarantee that the artifact will be less severe at the new gradient null location than at the original location.

It has also been proposed that the phase and frequency directions can be swapped in cases where the gradient null artifact is severe. It is believed that this can be an effective management strategy for gradient null artifact reduction. However, this approach may not be practical for many applications because of motion artifacts. Additionally, it has been suggested that increasing the FOV can be helpful in preventing signal from a gradient null from aliasing into the imaging volume. However, simply increasing the FOV does not prevent ghosting of the signal from overlaying the reconstructed image. Further, simply repositioning the subject to shift the relative location of the artifact is believed ineffective and, moreover, generally inconvenient.

It has also been suggested that parallel imaging can be an effective approach for artifact reduction. Such an approach assumes that the ghosts from the gradient null signal are differently weighted (but otherwise exact), replicated copies of the true magnetization. However, this assumption is inapplicable to artifacts arising from gradient nulls. In other words, parallel imaging has been shown to be capable of reducing conventional ghosting in echo train pulses where the ghosting arises from signal within the imaging volume, not gradient nulls.

In another suggested solution, images from a multiple coil array are combined to cancel motion and flow artifacts. With this technique, the region where signal is to be canceled must be manually selected. The resulting signal cancellation removes artifacts from the entire image. However, this technique is not practical for those instances where the signal from the gradient null (the signal that would be canceled) is aliased into the imaging volume.

Further, in another technique, it has been suggested that parallel imaging may be used to force data consistency through the elimination of artifacts of several types. While gradient null artifacts are not specifically addressed with this approach; nevertheless, the technique is complex and computationally intensive.

It would therefore be desirable to have a technique for reducing the adverse effects of gradient nulls in a reconstruction image that is practical in its application and applicable for those instances when the signal from a gradient null is aliased into the imaging volume that does not require existing coil retrofitting.

BRIEF DESCRIPTION OF THE INVENTION

The present invention provides a system and method of gradient null artifact correction that overcome the aforementioned drawbacks. Coil sensitivity of a receive coil to a gradient null location is measured and, therefrom, a coil calibration value is determined and used to modify the MR data acquired with that receive coil. Coil sensitivity values are determined for each coil of a coil array and the data for each coil is respectively weighted. An image that is substantially free of gradient null artifacts or ghosting is then reconstructed from the weighted data.

Therefore, in accordance with one aspect, the invention includes an apparatus having a computer programmed to reduce artifacts associated with gradient null locations in MR imaging. The computer is programmed to define one or more gradient null locations and determine receive coil sensitivity at the one or more gradient null locations. The computer is further programmed to acquire MR data from multiple receive coils in an FOV and weight the MR data based on the determined receive coil sensitivity, respectively. The computer is also programmed to reconstruct an image by combining the weighted MR data from the multiple receive coils, wherein the reconstructed image has reduced artifacts from the one or more gradient null locations According to another aspect of the invention, a method of MR imaging includes determining a value of coil sensitivity of a given coil of a plurality of coils to at least one gradient null and acquiring MR data from an FOV with the given coil. The method further includes weighting the acquired MR data by the value of coil sensitivity for the given coil.

In accordance with another aspect of the invention, an MR imaging apparatus includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR imaging apparatus also includes a computer programmed to acquire coil sensitivity data of each coil of a coil array to at least one gradient null location and acquire imaging data from an FOV with the coil array. The computer is further programmed to calibrate the imaging data with the coil sensitivity data to reduce gradient null artifacts in the imaging data and reconstruct an image of the FOV from the imaging data that is substantially free of gradient null artifacts In accordance with another aspect of the invention, the invention is embodied in a computer program stored on a computer readable storage medium and having instructions which, when executed by a computer, cause the computer to determine a first coil sensitivity to an imaging volume and a second coil sensitivity to at least one gradient null location for a given coil of a receive coil array. The computer is further caused to determine a coil calibration weighting factor for the given coil of the receive coil array from the first and second coil sensitivities. The computer then weights the imaging data acquired with the given coil of the receive coil array by the calibration weighting factor. The aforementioned acts are then repeated for each coil of the receive coil array followed by reconstruction of an image from the weighted data for all the coils of the receive coil array that is substantially free of gradient null artifacts.

According to a further aspect, the invention is embodied in a method of MR imaging with reduced ghosting. The method includes locating areas of gradient field nulling that produce adverse effects in reconstructed MR images and acquiring MR data. The method further includes determining a true-like object magnetization of the acquired MR data by reducing the adverse effects of the located areas of gradient field nulling and reconstructing an image from the true-like object magnetization.

In another aspect of the invention, a method of reducing noise in MR data that has been processed for artifact reduction is disclosed. The method includes initiating a coil sensitivity calibration scan and acquiring a priori data about gradient null locations from the coil sensitivity calibration scan. From the a priori data, the method determines frequency encoding locations that correspond to gradient null locations. A regularization with a strength at those frequency encoding locations corresponding to gradient null locations that is less than that applied at frequency encoding directions not corresponding to gradient null locations is then applied.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
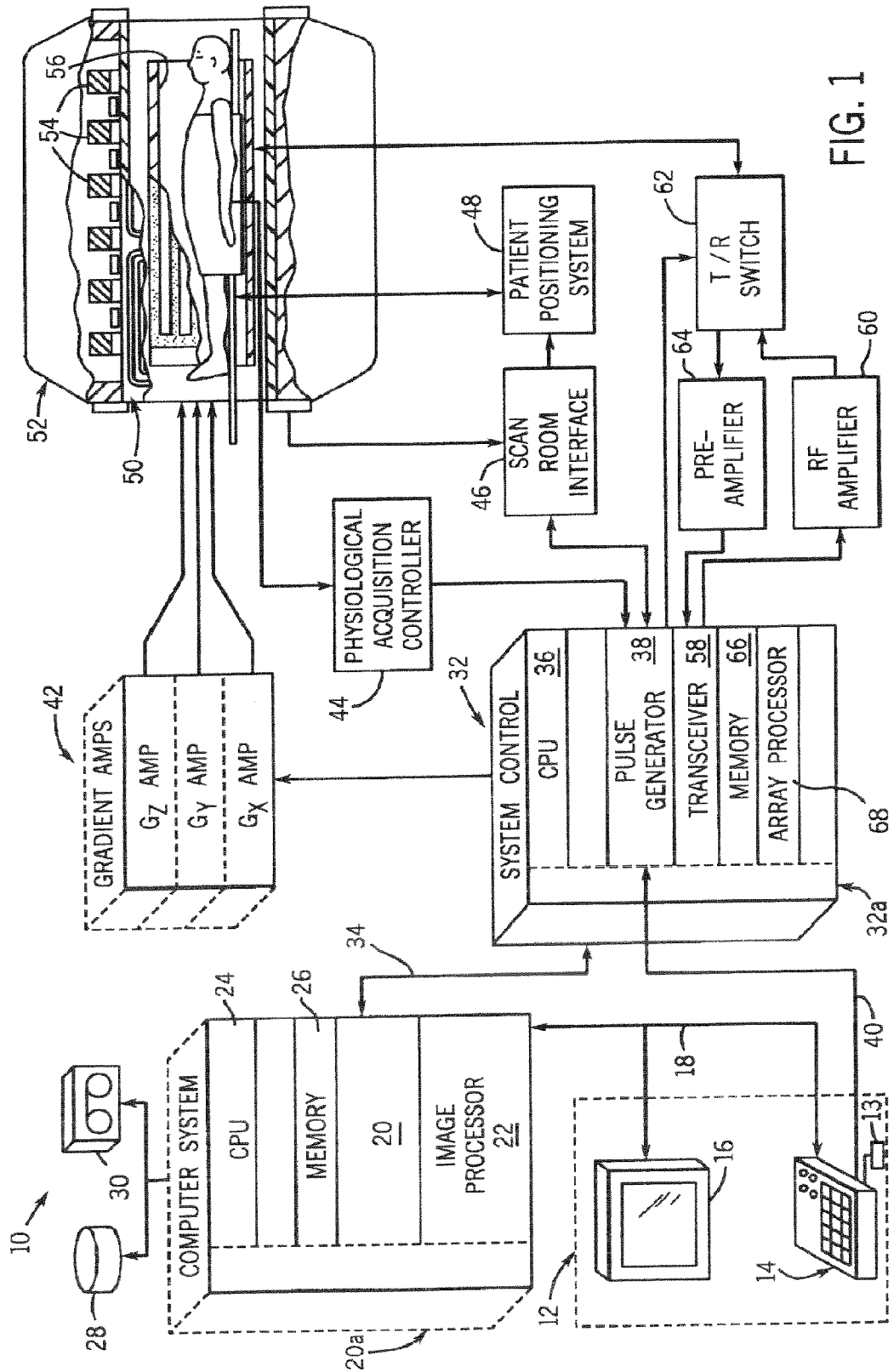
FIG. 1 is a schematic block diagram of an MR imaging system for use with the present invention.

Referring to FIG. 1, the major components of a preferred MR imaging system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a method of MR imaging with reduced gradient null artifacts that is applicable with the MR system illustrated in FIG. 1, or equivalents thereof. As will be described, the invention can be embodied in a method as well as a computer programmed that is executed by one or more computers of an MR system. In this regard, the invention may be found in a computer data signal that is embodied in a carrier wave that is downloadable or uploadable to an MR system. As will be described, the invention is particularly applicable with parallel imaging where a multi-coil array is used to acquire imaging data.

Parallel imaging techniques, such as SENSitivity Encoding (SENSE) reduce MR data acquisition by using an array of receive coils for receiving the MR signals from the excited imaging volume. Acquisition time is reduced by increasing the step size between phase encoding lines, or equivalently, by reducing the FOV. If the object of interest, however, extends outside the reduced FOV, aliasing or wrapping can occur in the phase encoding direction. Parallel imaging techniques have been developed to reduce the adverse affects of this aliasing by combining aliased images from multiple receive coils using weighting factors that cause the aliasing to cancel; however, these known techniques have not been effective in reducing the adverse effects of gradient nulls.

As will be described in greater detail below, the present invention is directed to an imaging technique for reducing the impact of gradient nulls on a reconstructed image. This technique utilizes coil sensitivity data that is acquired during a coil calibration scan. The calibration scan may be separate or integrated with the imaging data scan. In this regard, each pixel in an aliased image is considered a superposition of a true object magnetization and an artifact magnetization, both unknown. The artifact magnetization, in general, has no resemblance to the true object of interest and arises from a highly localized area that lies outside the area of interest of the true object. As such, the coil sensitivity data that is acquired is used to find an unaliased spin distribution and, ultimately, combine the images from the coils of the coil array in such a manner that the gradient null ghosting is canceled.

That is, the reconstructed MR image, $I_j(y)$, for each receive coil, j, of the coil array is defined by the magnetization multiplied by the sensitivity of the receive coil, $C_j(y)$. In other words:

$$I_j(y)=C_j(y)M(y) \quad \text{(Eqn. 1)}.$$

When the k-space data is modulated either due to effects within the pulse sequence or due to system hardware instability, the image is a convolution of the ideal image, as defined by Eqn. 1, with some point spread function, P(y). Thus:

$$I_j(y)=P(y)*[C_j(y)M(y)] \quad \text{(Eqn. 2)},$$

where * denotes convolution. The exact functional form of P(y) is determined by the temporal modulation pattern of the signal (for example, 60 Hz line frequency modulation) and the phase encoding order of the pulse sequence. Generally, P(y) is unknown.

The magnetization, M(y), is considered to be the sum of some "true" magnetization, $M_0$, that is spatially encoded correctly and an additional highly localized artifact signal, $M_a$, that originates from a gradient null. Thus:

$$M(y)=M_0(y)+M_a(y) \quad \text{(Eqn. 3)}.$$

$M_a$ is considered to be highly localized and thus:

$$M_a(y)=\delta(y-y_a) \quad \text{(Eqn. 4)},$$

where $y_a$ is the location of the gradient null. Inserting Eqns. 3 and 4 into Eqn. 2 yields:

$$I_j(y)=P(y)*[C_jM_0](y)+P(y-y_a)C_j(y_a) \quad \text{(Eqn. 5)}.$$

Since the coil sensitivity typically does not have a significant high spatial frequency content, then:

$$P(y)*[C_jM_0](y) \approx C_j(y)[P*M_0](y) \quad \text{(Eqn. 6)}.$$

Absorbing the point spread function into the definition of $M_0$, the final result for the image can be characterized by:

$$I_j(y)=C_j(y)M_0(y)+P(y-y_a)C_j(y_a) \quad \text{(Eqn. 7)}.$$

Therefore, Eqn. 7 illustrates that the gradient null artifact is approximately proportional to the point spread function centered at the gradient null location, $P(y-y_a)$, weighted by the coil sensitivity at the null, $C_j(y_a)$. For two or more receive coils, the system of equations in Eqn. 7 can be solved to provide a measure of the true magnetization, $M_0$, if estimates of the receive coil sensitivity with in the imaging volume, $C_j(y)$ and the sensitivity at the null location, $C_j(y_a)$, are known. While an estimate of the shifted artifact point spread function, $P(y-y_a)$, is provided, for purposes of this invention, it is discarded. One skilled in the art will appreciate that the image characterized by Eqn. 7 can be considered as the description of two-fold aliasing of a fictitious object that comprises of the true object magnetization, $M_0$, in one-half of the doubled FOV and $P(y-y_a)$ in the other half of the doubled FOV.

For a four coil array, Eqn. 7 can be solved using conventional matrix math. That is, matrices I, C, and M can be defined as:

$$I=\begin{pmatrix} I_0(y) \\ I_1(y) \\ I_2(y) \\ I_3(y) \end{pmatrix}, C=\begin{pmatrix} C_0(y) & C_0(y_a) \\ C_1(y) & C_1(y_a) \\ C_1(y) & C_2(y_a) \\ C_3(y) & C_3(y_a) \end{pmatrix}, M=\begin{pmatrix} M_0(y) \\ P(y-y_a) \end{pmatrix}. \quad \text{(Eqn. 8)}$$

Using matrix notation, Eqn. 7 can be written as:

$$I=CM \quad \text{(Eqn. 9)}.$$

The optimal solution of Eqn. 9 can be defined as:

$$\hat{M}=(C^\dagger C)^{-1}C^\dagger I \quad \text{(Eqn. 10)},$$

where $\hat{M}$ is the estimated solution vector and † denotes the Hermitian conjugate.

One skilled in the art will appreciate that since aliasing and ghosting effects are the same at all frequency encoding directions, x, only that which occurs in the phase encoding direction, y, needs to be considered. As such, the frequency encoding variable has been omitted from the above equations. However, processing for gradient null artifact reduction takes place at each frequency encoding location, x.

Further, in the above mathematical description of the invention, it has been assumed that the FOV was large enough that the gradient null location and the artifacts associated with the gradient null at that location were contained within the FOV. In other words, no phase wrap was assumed for Eqns. 1-10. However, since a larger FOV requires greater scan time, it may be desirable to define the FOV to be so small that the gradient null location lies outside the FOV. In such an instance, the gradient null artifact may wrap or alias within the prescribed FOV. As such, Eqn. 7 can be written as:

$$I_j(y) = C_j(y)M_0(y) + C_j(y_a)\sum_k P(y - y_a - kL), \quad \text{(Eqn. 11)}$$

where L is the prescribed FOV (replication or aliasing distance) and the summation is the mathematical representation of aliasing. In Eqn. 11, the artifact term is still weighted by the $C_j(y_a)$ as in Eqn. 7. Thus, processing is similar for both cases, resulting in an expression of true object magnetization, $M_0$, as set forth previously.

If the FOV is sufficiently small than the object may alias itself. As such, Eqn. 11 can be rewritten as:

$$I_j(y) = \sum_m C_j(y - mL)M_0(y - mL) + C_j(y_a)\sum_k P(y - y_a - kL). \quad \text{(Eqn. 12)}$$

The artifact may still be removed by coil sensitivity weighting, but a higher reduction factor is used. For example, assuming R aliased replicates at a given pixel (R terms in the summation of the first term in Eqn. 12), instead of assuming R-fold aliasing, (R+1)-fold aliasing is used to additionally remove the second term in Eqn. 12. Processing then results in the true object magnetization, $M_0$, and the aliased point spread function, which is discarded.

For Eqns. 1-12 it has been assumed that only one gradient null (located either superior or inferior to the imaging volume) contributes artifact signal. However, the present invention is equivalently applicable with cases in which more than one gradient null contributes artifact signal. For example, for two gradient nulls, one superior and one inferior to the imaging volume, both are corrected with corresponding terms that describe the image artifact in Eqns. 7, 11, or 12.

As described above and set forth in the above mathematical expressions, coil sensitivity data is used to weight the acquired MR data for the coils of a coil array, respectively. In this regard, the invention contemplates application of a coil calibration scan whereby low spatial resolution MR data is acquired. It is contemplated that such a scan can be performed separately or incorporated within the parallel imaging scan. When incorporated with the parallel imaging scan, the calibration is considered to be a "self-calibration".

When calibration is carried out separately from the parallel imaging scan, it is preferred that the pulse sequence to acquire the low resolution MR data be free of signal modulations that would otherwise result in ghosting. Moreover, the pulse sequence should give a good signal from the gradient null location(s) so that the gradient null locations can be easily identified. Since the gradient null location is generally outside the imaging volume, the $B_0$ homogeneity is generally poor in the null location and a gradient echo, if a gradient echo sequence is used, results in little or no signal at the null. Therefore, in a preferred embodiment, a 2D spin echo sequence with low spatial resolution (32×32 cm matrix with 32 or more 5 mm contiguous slices) and short repetition time (TR=500-700 msec.) is used to acquire the coil calibration data. The spin echo gives relatively high signal at the null even with substantial $B_0$ field inhomogeneity. Signal modulation during the calibration scan can be reduced by using dummy acquisitions to bring the longitudinal magnetization into equilibrium. Thirty-two acquisitions are believed sufficient. Because the calibration scan can be carried out on the order of one minute, breath-holding may not be required.

Self-calibration may be used if the FOV in the phase encoding direction is sufficiently large that signal from the null location is not aliased within the displayed FOV. For spine imaging, a no phase wrap FOV is typically used to avoid aliasing of the null signal. Thus, self-calibration is particularly applicable for spine imaging. Although the null signal is not superposed on the subject anatomy in this case, ghosting of the null is superposed and can contaminate sensitivity measurements unless removed. Smoothing of the calibration data may be used to remove the ghost. Such smoothing can be effectively done by multiplying the k-space data by an appropriate window followed by a 2D Fourier transformation. It is noted that the k-space window that is used to smooth the sensitivity data should be similar to the k-space window that is applied to the k-space data when a separate calibration scan with low spatial resolution is used.

Once the coil calibration data is acquired, either in a separate scan or through self-calibration, one of a number of known algorithms may be used to determine $C_j(y)$. In one technique, $$C_j(y) = \frac{I_j^{cal}(y)}{\sqrt{\sum_j |I_j^{cal}(y)|^2}}, \quad \text{(Eqn. 13)}$$

where $I_j^{cal}(y)$ is the complex calibration image. Division by $$\sqrt{\sum_j |I_j^{cal}(y)|^2}$$

in Eqn. 13 removes weighting by the magnetization. The image that results from solving for $M_0$ using this calibration is then weighted by $$\sqrt{\sum_j |C_j(y)|^2},$$

thereby giving the image a conventional appearance. One skilled in the art will appreciate that other normalizations are possible, for example, in another known technique, a body coil image is acquired and used as the denominator in Eqn. 13. For the case where only one null is corrected, an algorithm for determining $C_j(y_a)$ includes first finding the point outside the displayed or desired FOV where the denominator in Eqn. 13 (either $$\sqrt{\sum_j |I_j^{cal}(y)|^2}$$

or the magnitude of the body coil image) has the highest amplitude. This point is considered to be $y_a$. Thus, $C_j(y_a)$ is given by Eqn. 13 evaluated at $y_a$.

It is recognized that in addition to determine a given coil's sensitivity as a function of the ratio of the complex calibration image to a body coil image, coil calibration for a given coil can be determined relative to the sensitivity of other coils in the receive coil array. That is, rather than determining coil calibration by comparing a given coil to the whole body transmit coil, it is contemplated that coil calibration for a given coil can be determined by comparing the sensitivity of the given coil to the respective sensitivities of the other coils in the array.

One skilled in the art of parallel imaging will appreciate that one drawback of parallel imaging for removing artifacts is amplification of image noise. Regularization is a numerical method that can be used with parallel imaging for decreasing noise amplification at the expense of uncorrected aliasing. As such, it is contemplated that regularization can be used to decrease the noise amplification at the expense of residual artifact. While a number of regularization methods may be used, in a preferred embodiment, a regularization technique is implemented that uses the coil calibration scan to acquire a priori information about the location of the gradient null. In this regard, the regularization is low near the gradient null location which results in a high degree of artifact removal but increased noise amplification. Regularization is higher elsewhere giving lower noise but allowing higher artifact. Since artifact suppression should not be necessary far from the artifact location, this regularization technique is effective.

Moreover, this regularization scheme can be incorporated into a number of regularization techniques. For example, the scheme may be implemented with regularizations that the limit the minimum eigenvalues when computing the matrix inverse in Eqn. 10, or regularizations that add terms to the diagonal elements of the matrix $C^\dagger C$ in Eqn. 10 prior to computing its inverse. The size of the regularization is given by a monotonically increasing function of $|x-x_a|$ where $x_a$ is the frequency encoding location of the null signal. An example function is:

$$r(x)=a(1-e^{-|x-x_a|/w})+b \quad \text{(Eqn. 14)},$$

where $r(x)$ is the size of the regularization (lower eigenvalue limit or diagonal matrix term) at each frequency encoding location, x. The constants a, b and w are used to control the upper and lower limits of the regularization and the rate of increase away from the gradient null location.

Figure 2:
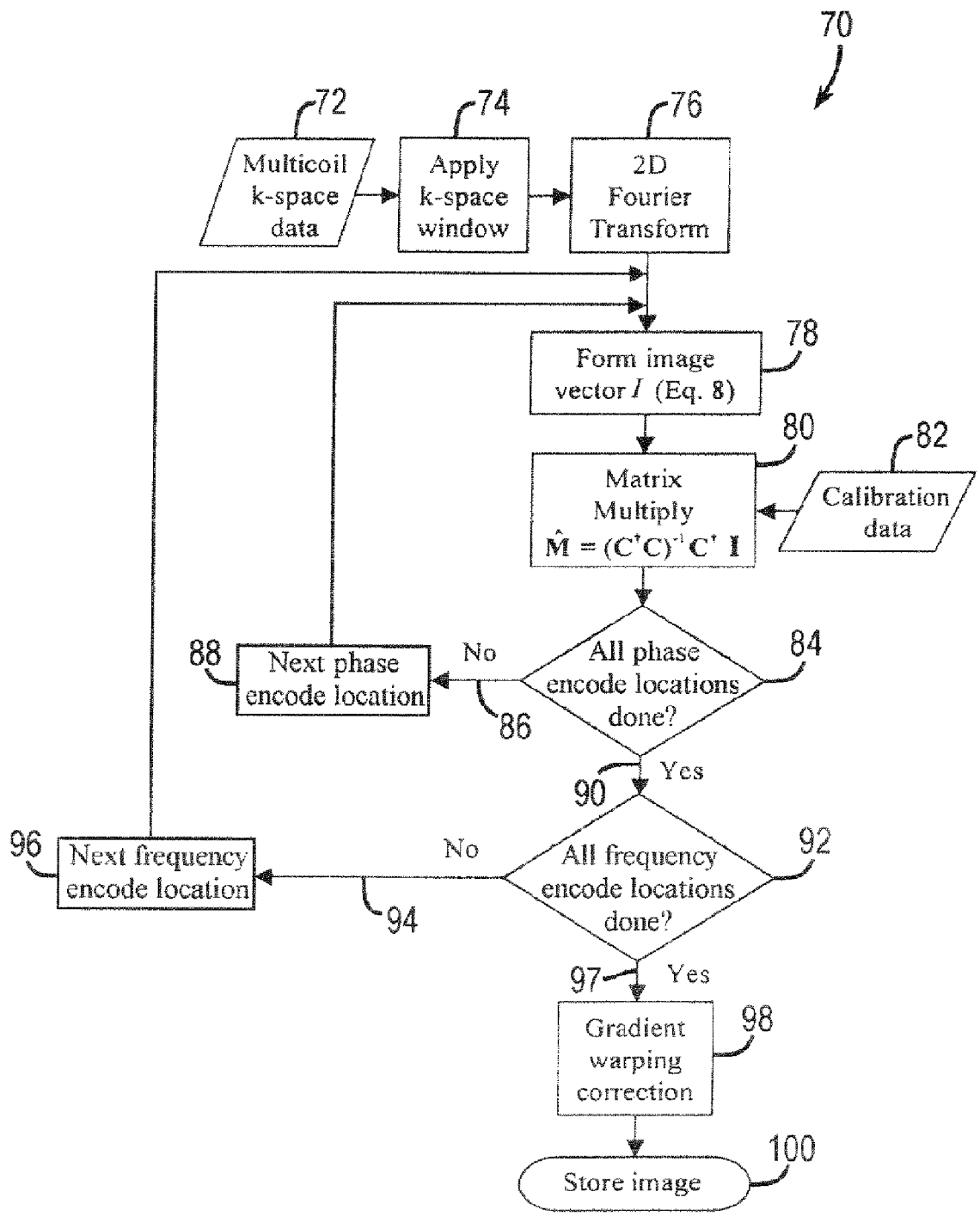
FIG. 2 is a flow chart setting forth the steps of an image reconstruction process in accordance with one aspect of the present invention.

Referring now to FIG. 2, the steps of a reconstruction process 70 for generating images substantially free of gradient null ghosting in accordance with the present invention are illustrated. Process 70, begins with the acquisition of multi-coil k-space data at 72. A k-space window is applied 74 followed by a 2D Fourier transform 76. An image vector is then formed at 78, as defined by Eqn. 8. Equation 9 is then solved for $\hat{M}$ as defined by Eqn. 10 at 80 using coil calibration data 82 that is determined by a calibration process, as will be described with respect to FIG. 3.

Once the estimated solution vector $\hat{M}$ has been determined 80, the process 70 determines if all phase encode locations for a given frequency encode location have been evaluated 84. If not 84, 86, the next phase encode location is evaluated 88 and the process loops back to step 78 with formation of an image vector for the new phase encode location. On the other hand, if all phase encode locations have been evaluated for a given frequency encode location 84, 90, the process determines if there are remaining frequency encoding location that are to be evaluated 92. If not 92, 94, the process proceeds with evaluation of the next frequency encoding location 96 and returns to step 78 for further processing. If all frequency encoding locations have been evaluated 92, 97, the modified data undergoes gradient warping correction 98 and the resulting image is stored 100.

Figure 3:
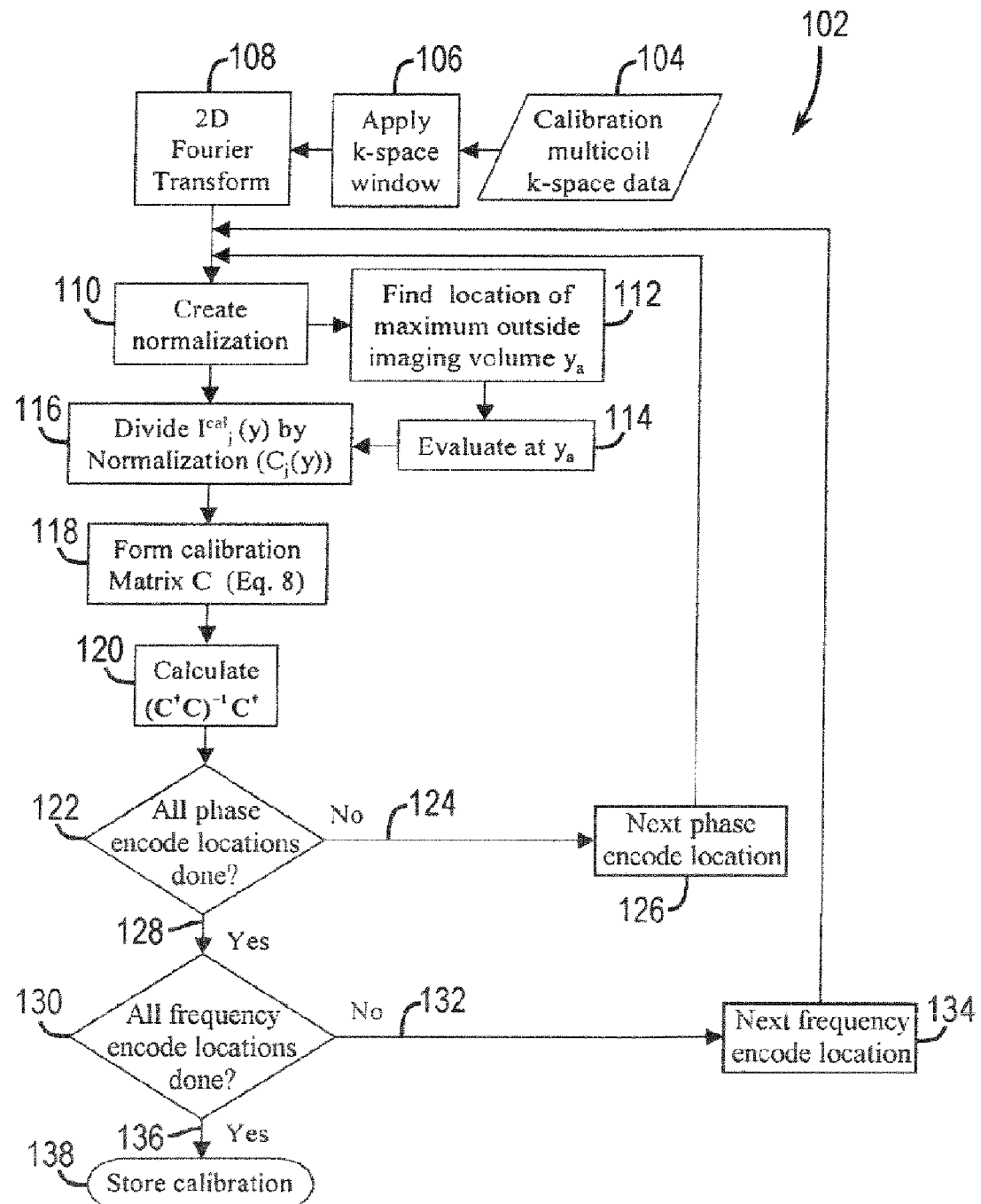
FIG. 3 is a flow chart setting forth the steps of a coil calibration process in accordance with another aspect of the present invention.

Referring now to FIG. 3, the steps of a calibration process 102 are shown. The calibration process, like the reconstruction process, begins with the acquisition of multi-coil k-space data. For the calibration process, low spatial resolution k-space data is acquired 104. An appropriate k-space window is applied 106 to the k-space data followed by a 2D Fourier transform 108. A normalization is then created at 110. From there, process 102 determines the location of a gradient null outside the imaging volume 112. The signal at this null location is then evaluated at 114. Thereafter, $I^{cal}_j(y)$ is divided by the normalization ($C_j(y)$) 116. Therefore, a calibration matrix, such as that defined by Eqn. 8, is determined 118 for a given phase encode location of a given frequency encode location. $(C^\dagger C)^{-1}C^\dagger$ is then calculated at 120. As described in FIG. 2, the dot product of $(C^\dagger C)^{-1}C^\dagger$ and I provides $\hat{M}$.

The calibration process then determines if all phase encoding locations have been evaluated 122. If not 122, 124, the process proceeds to the next phase encoding location of the current frequency encoding location 126 and loops back to step 110 for further processing. If so 122, 128, the calibration process proceeds to determine if another frequency encoding location needs to be evaluated 130. If so 130, 132, the process proceeds to the next frequency encoding location 134. If not 130, 136, the calibration process is complete and the calibration is stored at 138. In this regard, a calibration matrix or weighting factor is determined for each phase encode location and for each frequency encoding location of the imaging volume.

Figure 4:
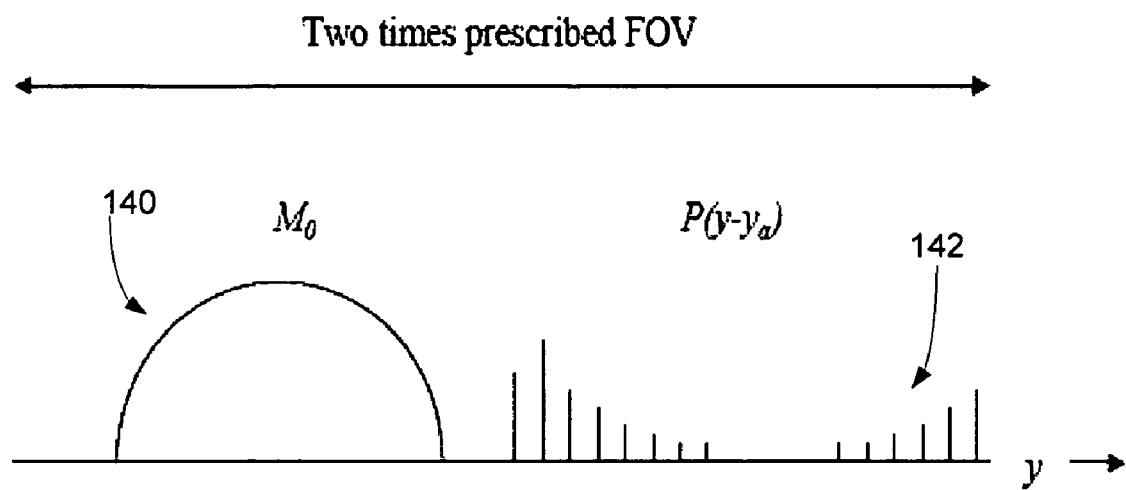
FIG. 4 is a schematic of a 2× prescribed FOV illustrating segmentation of true object magnetization and artifact magnetization.
Figure 5:
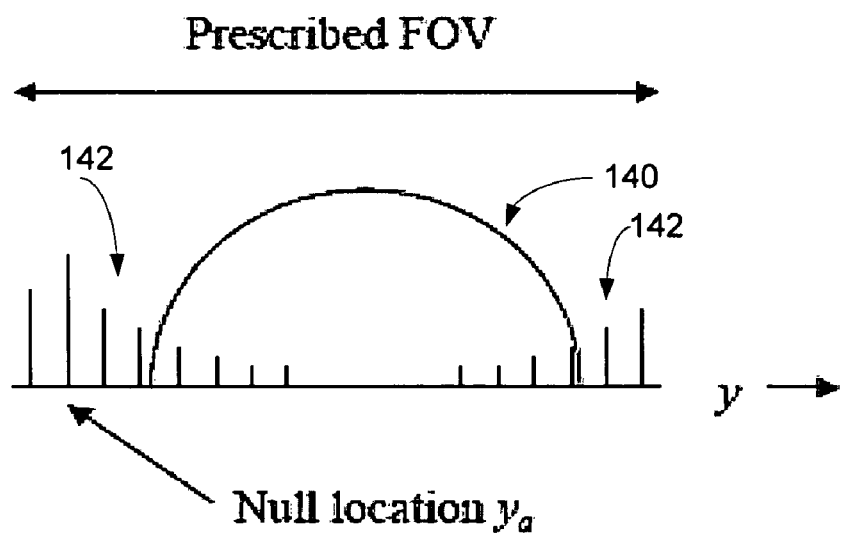
FIG. 5 is a schematic of a prescribed FOV illustrating superposition of true object and artifact magnetization.

As described previously, the present invention can be characterized as two-fold aliasing of a fictitious object over a doubled FOV. This is illustrated in FIGS. 4-5. As shown in FIG. 4, the fictitious object is defined by true object magnetization 140 in one-half of the doubled FOV and the shifted point spread function 142 in the other half of the doubled FOV. Two-fold aliasing of the fictitious object results in the actual image shown in FIG. 5. That is, two-fold aliasing results in the null location, $y_a$, falling within the prescribed FOV. By applying the reconstruction process described with respect to FIG. 2, the true object magnetization and the point spread function can be separated from one another. As such, the point spread function can be ignored and an image reconstructed from the true object magnetization. In this regard, a gradient null ghost-free image can be reconstructed.

Figure 6:
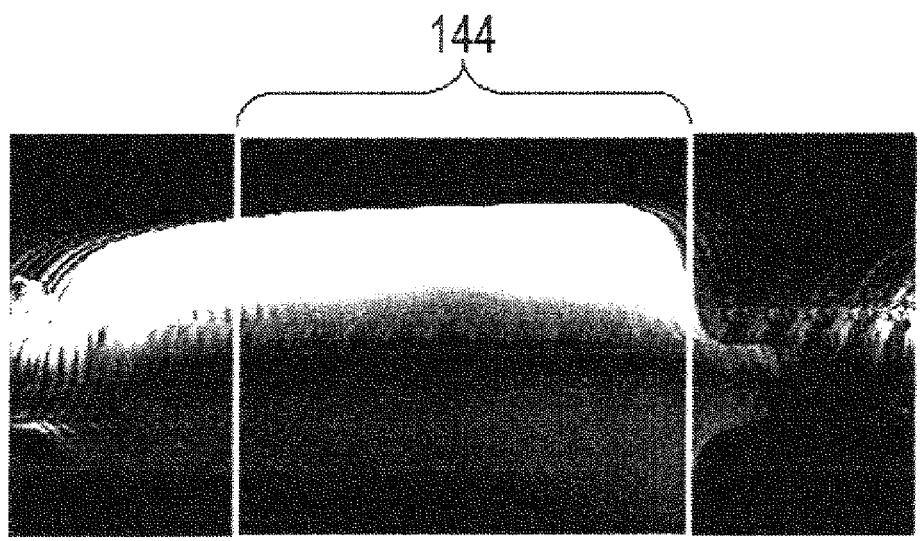
FIG. 6 is an image of a phantom illustrating ghosting and aliasing artifacts that can result in a known data acquisition and image reconstruction process.
Figure 7:
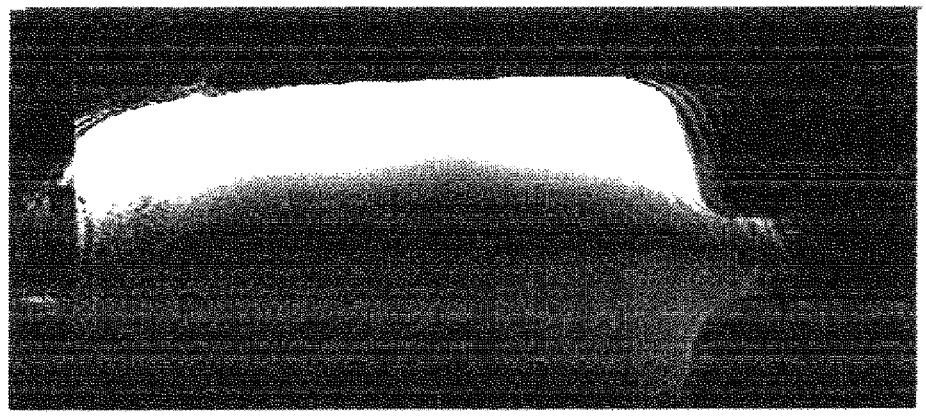
FIG. 7 is a corrected image of that shown in FIG. 6 according to one aspect of the invention.
Figure 8:
FIG. 8 is an artifact image of the artifacts present in the image of FIG. 6.
Figure 9:
FIG. 9 is a corrected image of that shown in FIG. 6 according to another aspect of the invention.

Advantages in image quality achieved with the present invention are illustrated in FIGS. 6-9. FIG. 6 is a sagittal slice image reconstructed from data acquired of phantom using a 4-channel lumbar spine coil array. As shown, ghosting and aliasing artifacts from gradient nulls are present. As a result, with such an image, the FOV that would be normally displayed 144 in an image is less than the FOV or spatial coverage of the coil array so that the gradient null artifacts are not displayed. In contrast, FIG. 7 is a corrected image in accordance with the reconstruction process described herein. As shown, the adverse effects of the gradient nulls have been reduced and do not appear in an image of the entire FOV. FIG. 8 is an artifact image and represents that which was removed from FIG. 6 to yield the image of FIG. 7. Additionally, the image of FIG. 7 was weighted by calibration factors that were determined from calibration data that was acquired in a separate calibration scan. In the image of FIG. 9, the calibration that was applied to the imaging data was derived in a self-calibration scan.

Figure 10:
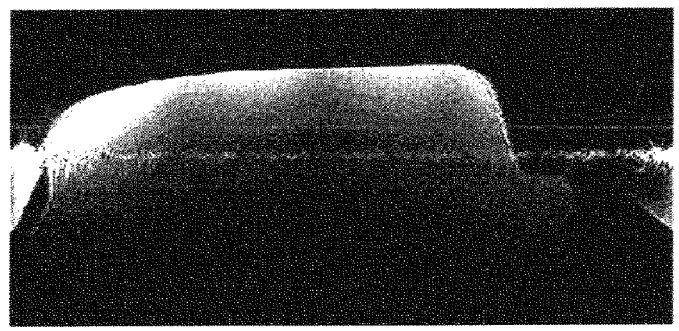
FIG. 10 is an image of a phantom reconstructed using known reconstruction techniques and without regularization.
Figure 11:
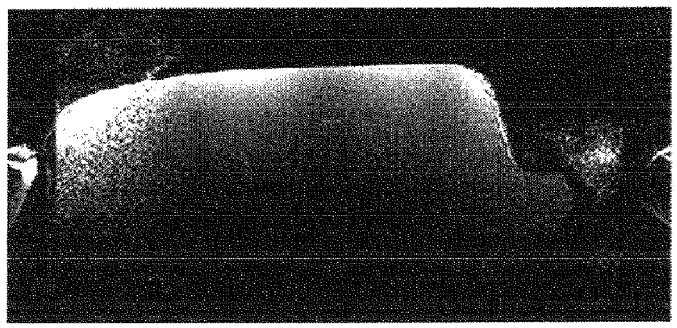
FIG. 11 is an image of the phantom corrected for gradient nulling but without regularization according to one aspect of the invention.
Figure 12:
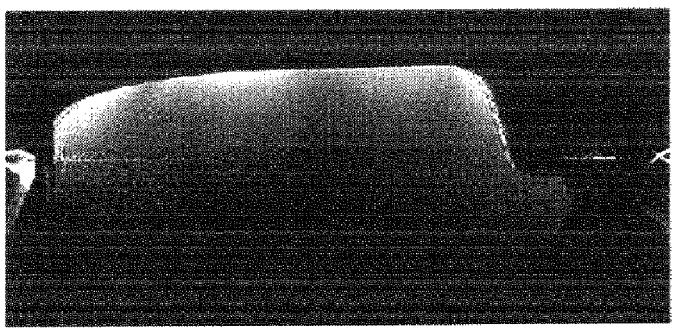
FIG. 12 is an image of the phantom corrected for gradient nulling and with regularization according to a further aspect of the invention.

Referring now to FIGS. 10-12, the impact of regularization is illustrated. In the image of FIG. 10, correction for gradient null artifacts has not been carried out. In the image of FIG. 11, gradient null correction has been applied in accordance with the reconstruction process described herein, but without regularization. As shown, the ghosting in the image of FIG. 10 is not seen in the image of FIG. 11. FIG. 12, however, is an image based on MR data that has been corrected for gradient null artifacts and subjected to the regularization defined by Eqn. 14, where a=0.01, b=0.001, and w=2 pixels. As shown in the images, without regularization, the image noise is increased by the correction for gradient null artifacts.

As described herein, the present invention is effective in reducing the adverse effects of gradient nulls on MR images. Additionally, the present invention may allow for improvements in magnet, gradient, and RF designs that support shorter magnets and wider subject bores. Moreover, the invention may be incorporated into existing parallel imaging paradigms and thus addresses the adverse effects of gradient nulling without hardware retrofitting.

Therefore, an apparatus has a computer programmed to reduce artifacts associated with gradient null locations in MR imaging. The computer is programmed to define one or more gradient null locations and determine receive coil sensitivity at the one or more gradient null locations. The computer is further programmed to acquire MR data from multiple receive coils in an FOV and weight the MR data based on the determined receive coil sensitivity, respectively. The computer is also programmed to reconstruct an image by combining the weighted MR data from the multiple receive coils, wherein the reconstructed image has reduced artifacts from the one or more gradient null locations A method of MR imaging is disclosed and includes determining a value of coil sensitivity of a given coil of a plurality of coils to at least one gradient null and acquiring MR data from an FOV with the given coil. The method further includes weighting the acquired MR data by the value of coil sensitivity for the given coil.

An MR imaging apparatus is also disclosed and includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR imaging apparatus also includes a computer programmed to acquire coil sensitivity data of each coil of a coil array to at least one gradient null location and acquire imaging data from an FOV with the coil array. The computer is further programmed to calibrate the imaging data with the coil sensitivity data to reduce gradient null artifacts in the imaging data and reconstruct an image of the FOV from the imaging data that is substantially free of gradient null artifacts The invention may also be embodied in a computer program stored on a computer readable storage medium and having instructions which, when executed by a computer, cause the computer to determine a first coil sensitivity to an imaging volume and a second coil sensitivity to at least one gradient null location for a given coil of a receive coil array. The computer is further caused to determine a coil calibration weighting factor for the given coil of the receive coil array from the first and second coil sensitivities. The computer then weights the imaging data acquired with the given coil of the receive coil array by the calibration weighting factor. The aforementioned acts are then repeated for each coil of the receive coil array followed by reconstruction of an image from the weighted data for all the coils of the receive coil array that is substantially free of gradient null artifacts.

The invention may also be embodied in a method of MR imaging with reduced ghosting. The method includes locating areas of gradient field nulling that produce adverse effects in reconstructed MR images and acquiring MR data. The method further includes determining a true-like object magnetization of the acquired MR data by reducing the adverse effects of the located areas of gradient field nulling and reconstructing an image from the true-like object magnetization.

A method of reducing noise in MR data that has been processed for artifact reduction is disclosed. The method includes initiating a coil sensitivity calibration scan and acquiring a priori data about gradient null locations from the coil sensitivity calibration scan. From the a priori data, the method determines frequency encoding locations that correspond to gradient null locations. A regularization with a strength at those frequency encoding locations corresponding to gradient null locations that is less than that applied at frequency encoding directions not corresponding to gradient null locations is then applied.

The present invention has been described in terms of the preferred embodiment, and it is recognized that equivalents, alternatives, and modifications, aside from those expressly stated, are possible and within the scope of the appending claims.

What is claimed is:

1. An MR imaging system comprising:
   a plurality of gradient coils positioned about a bore of a main magnet and configured to impress gradient fields;
   an RF coil assembly having a plurality of coil elements;
   an RF transceiver controlled by a pulse module to transmit RF pulses via the RF coil assembly and receive MR signals; and
   a controller programmed to:
      determine a coil sensitivity at an imaging volume and a coil sensitivity at a gradient field null for each of the plurality of coil elements;
      input MR signals acquired by the plurality of coil elements;
      determine magnetization values from the MR signals, using the coil sensitivities at the imaging volume, the coil sensitivities at the gradient field null, and an artifact function; and
      reconstruct an image based on the magnetization values.

2. The MR imaging system of claim 1 wherein the controller is further programmed to determine the magnetization values using a SENSE technique.

3. The MR imaging system of claim 2 wherein the controller is further programmed to apply the SENSE technique to the MR signals acquired by the plurality of coil elements as a two fold aliasing of an object which includes the magnetization values in one half of a FOV and the artifact function in another half of the FOV.

4. The MR imaging system of claim 1 wherein the artifact function is a point spread function determined by a temporal modulation pattern and a phase encoding order of a pulse sequence used to acquire the MR signals.

5. The MR imaging system of claim 1 wherein the controller is further programmed to determine the coil sensitivities during a parallel imaging sequence using a self-calibration technique, and wherein a FOV of the sequence is large enough in a phase encoding direction to substantially prevent gradient null signal aliasing.

6. The MR imaging system of claim 1 wherein the controller is further programmed to apply a regularization to the MR signals, wherein the regularization utilizes a priori information about a location of the gradient field null to decrease a noise amplification resulting from parallel imaging reconstruction of the magnetization values.

7. The MR imaging system of claim 1 wherein the controller is further programmed to instruct the pulse module to transmit a spin echo pulse sequence adapted to produce a relatively high signal strength for the gradient null region.

8. A method of magnetic resonance (MR) imaging comprising:
   executing a parallel imaging sequence to obtain MR data;
   correcting the MR data for artifacts caused by a gradient null region; and
   reconstructing and displaying an image from the corrected MR data.

9. The method of claim 8 further comprising obtaining coil sensitivity data for a field of view (FOV) and the gradient null region, for an array of receive coils.

10. The method of claim 9 further comprising obtaining the coil sensitivity data during the parallel imaging sequence using a self-calibration technique and wherein the FOV is large enough in a phase encoding direction to substantially prevent gradient null aliasing.

11. The method of claim 9 further comprising obtaining the coil sensitivity data using a spin echo pulse sequence adapted to produce a relatively high signal strength for the gradient null region.

12. The method of claim 8 further comprising correcting the MR data for artifacts caused more than one gradient null region.

13. The method of claim 8 wherein correcting the MR data includes separating a substantially correctly-encoded magnetization signal from an artifact signal induced by the gradient null region.

14. The method of claim 13 further comprising weighting the substantially correctly-encoded magnetization signal by a function of coil sensitivity.

15. The method of claim 8 further comprising determining a FOV for the parallel imaging sequence that is small enough to exclude the gradient null region.

16. A non-transitory computer-readable storage medium having a set of instructions stored thereon which, when executed by a computer, cause the computer to:
   obtain multi-channel MR data indicative of apparent magnetization values in a field of view (FOV);
   separate the multi-channel MR data indicative of the apparent magnetization values into generally correctly-encoded magnetization values and a gradient null artifact signal;
   reconstruct a set of image data, with reduced gradient null artifacts, from the generally correctly-encoded magnetization values and store the set of image data in a memory.

17. The non-transitory computer-readable storage medium of claim 16 wherein the instructions further cause the computer to obtain coil sensitivity data for a FOV and for a gradient null location.

18. The non-transitory computer-readable storage medium of claim 17 wherein the coil sensitivity data is derived from data acquired via at least one of a calibration scan and a self-calibration imaging sequence.

19. The non-transitory computer-readable storage medium of claim 16 wherein the gradient null artifact signal represents a point spread function.

20. The non-transitory computer-readable storage medium of claim 16 wherein the FOV is a no-phase wrap FOV.

21. The non-transitory computer-readable storage medium of claim 16 wherein the set of instructions further causes the computer to reconstruct the set of image data according to a SENSE technique.

22. The non-transitory computer-readable storage medium of claim 21 wherein the SENSE technique is adapted to process the apparent magnetization values as a two-fold aliasing of an object over a doubled FOV.

23. The non-transitory computer-readable storage medium of claim 22 wherein the two-fold aliasing of the object includes the generally correctly-encoded magnetization values in one half of the doubled FOV and the gradient null artifact signal in another half of the doubled FOV.

24. The non-transitory computer-readable storage medium of claim 16 wherein the FOV is small enough to exclude a gradient null region.

\* \* \* \* \*

UNITED STATES PATENT AND TRADEMARK OFFICE
CERTIFICATE OF CORRECTION

| | | |
|---|---|---|
| PATENT NO. | : 7,952,351 B2 | Page 1 of 1 |
| APPLICATION NO. | : 11/781025 | |
| DATED | : May 31, 2011 | |
| INVENTOR(S) | : King et al. | |

It is certified that error appears in the above-identified patent and that said Letters Patent is hereby corrected as shown below:

Title Page, Item (63), delete "2005." and substitute therefore -- 2005, now Pat. No. 7,250,762. --.

Signed and Sealed this
Ninth Day of August, 2011

David J. Kappos
*Director of the United States Patent and Trademark Office*